(12) United States Patent
Morimoto

(10) Patent No.: US 7,255,011 B2
(45) Date of Patent: Aug. 14, 2007

(54) RESISTANCE TYPE SENSOR

(75) Inventor: Hideo Morimoto, Nara (JP)

(73) Assignee: Nitta Corporation, Osaka (JP)

( * ) Notice: Subject to any disclaimer, the term of this patent is extended or adjusted under 35 U.S.C. 154(b) by 0 days.

(21) Appl. No.: 11/436,872

(22) Filed: May 18, 2006

(65) Prior Publication Data
US 2006/0278013 A1 Dec. 14, 2006

(30) Foreign Application Priority Data
May 31, 2005 (JP) ............................. 2005-159184

(51) Int. Cl.
G01B 7/16 (2006.01)
G01L 1/00 (2006.01)
(52) U.S. Cl. ...................................................... 73/781
(58) Field of Classification Search ................. 73/781, 73/862.473, 862.474
See application file for complete search history.

(56) References Cited
U.S. PATENT DOCUMENTS
7,064,561 B2 * 6/2006 Morimoto ................... 324/691
7,123,028 B2 * 10/2006 Okada et al. ................ 324/681

FOREIGN PATENT DOCUMENTS
JP 2004-037350 2/2004

OTHER PUBLICATIONS
Patent Abstracts of Japan—Publication No. 2004-037350 dated Feb. 5, 2004 (2 pages).

* cited by examiner

Primary Examiner—Michael Cygan
Assistant Examiner—O. Davis
(74) Attorney, Agent, or Firm—Osha Liang LLP

(57) ABSTRACT

Switches SW1 to SW4 and variable resistors are formed so as to overlap each other at positions corresponding to the X-axial positive direction, the X-axial negative direction, the Y-axial positive direction, and the Y-axial negative direction, respectively. When at least one of the switches SW1 to SW4 is off, no Z-axial output is activated and only X- and Y-axial outputs are activated. On the other hand, when any of the switches SW1 to SW4 is on, no X- and Y-axial outputs are activated and only a Z-axial output is activated.

8 Claims, 9 Drawing Sheets

RESISTANCE TYPE SENSOR

BACKGROUND OF THE INVENTION

1. Field of the Invention

The present invention relates to a resistance type sensor suitable for detecting a force externally applied.

2. Description of Related Art

A resistance type sensor is generally used for converting into electrical signals the magnitude and direction of a force applied by an operator. For example, in an input device for a cellular phone, a resistance type sensor for inputting multidimensional operations is incorporated as a so-called joystick.

A general resistance type sensor can output an X-axial signal corresponding to an X-axial direction; and a Y-axial signal corresponding to a Y-axial direction, for example, as disclosed in JP-A-2004-37350. The resistance type sensor can detect a force applied to an operation button, by resolving the force into its X- and Y-axial components.

In the case of applying such a resistance type sensor to a joystick, however, it is preferable that the sensor can output not only an X-axial signal corresponding to the X-axis and a Y-axial signal corresponding to the Y-axis, but also a Z-axial signal corresponding to a Z-axis different from the X- and Y-axes. For example, in the case of applying the resistance type sensor to a joystick for moving a cursor on the basis of X- and Y-axial outputs, and performing a predetermined operation such as clicking on the basis of a Z-axial output, the cursor can be moved to a predetermined position, for example, on an icon, by changing the X- and Y-axial outputs, and then the predetermined operation can be performed by changing the Z-axial output.

In the resistance type sensor capable of outputting X-, Y-, and Z-axial signals, however, an X-axial signal corresponding to an X-axial force Fx, a Y-axial signal corresponding to a Y-axial force Fy, and a Z-axial signal corresponding to a Z-axial force Fz, may be always output when any force is applied to the operation button. Therefore, when only the X- or Y-axial output is intended to be changed, the Z-axial output may also change. On the other hand, when only the Z-axial output is intended to be changed, the X- or Y-axial output may also change.

Thus, in the case of applying the resistance type sensor to a joystick, when a force is applied for moving the cursor, the predetermined operation may be erroneously performed because not only the X- and Y-axial outputs but also the Z-axial output changes. On the other hand, when a force is applied for performing the predetermined operation, the cursor may be moved because not only the Z-axial output but also the X- and Y-axial outputs change. This makes it difficult to perform the predetermined operation with keeping the cursor at the predetermined position.

SUMMARY OF THE INVENTION

An object of the present invention is to provide a resistance type sensor good in operability and few in erroneous operations.

According to an aspect of the present invention, a resistance type sensor comprises a detective member; a first electrode disposed on an X-axis so as to be opposed to the detective member; a second electrode disposed on a Y-axis so as to be opposed to the detective member; a third electrode disposed between the detective member and the first electrode so as to be opposed to the first electrode and displaceable toward the first electrode together with the detective member; a fourth electrode disposed between the detective member and the second electrode so as to be opposed to the second electrode and displaceable toward the second electrode together with the detective member; pressure-sensitive resistive materials disposed between the first and third electrodes and between the second and fourth electrodes; a plurality of first switch electrodes disposed so as to be opposed to the detective member and kept at a ground potential; and a plurality of second switch electrodes disposed so as to pair off with the respective first switch electrodes and be distant from the respective first switch electrodes. The second switch electrodes are kept at a potential different from the ground potential. Each of the second switch electrodes is displaceable toward the corresponding first switch electrode to come into contact with the corresponding first switch electrode when the detective member is displaced. When at least one pair of first and second switch electrodes are distant from each other, the sensor can detect displacement of a portion of the detective member corresponding to an X-axial direction on the basis of detection of a change in resistance value between the first and third electrodes; and can detect displacement of a portion of the detective member corresponding to a Y-axial direction on the basis of detection of a change in resistance value between the second and fourth electrodes. When any pair of first and second switch electrodes are in contact with each other, the sensor can detect a central portion of the detective member on the basis of detection of a change in resistance value between the first and third electrodes and a change in resistance value between the second and fourth electrodes.

According to the aspect of the above paragraph, when at least one pair of first and second switch electrodes are distant from each other, the sensor can detect displacement of the portion of the detective member corresponding to the X-axial direction on the basis of detection of a change in resistance value between the first and third electrodes; and can detect displacement of the portion of the detective member corresponding to the Y-axial direction on the basis of detection of a change in resistance value between the second and fourth electrodes. On the other hand, when any pair of first and second switch electrodes are in contact with each other, the sensor can detect the central portion of the detective member on the basis of detection of a change in resistance value between the first and third electrodes and a change in resistance value between the second and fourth electrodes. In short, the sensor can detect the displacements of the different portions of the detective member in accordance with conditions of contact between the plurality of pairs of first and second switch electrodes. Thus, X- and Y-axial outputs on the respective X- and Y-axes and an output on another axis than the X- and Y-axes, for example, a Z-axial output, can be obtained exclusively for each other. As a result, the operability is improved and erroneous operations decreases.

According to another aspect of the present invention, the sensor comprises a pair of first electrodes disposed so as to be X-axially distant from each other and symmetrical with respect to the Y-axis; and a pair of second electrodes disposed so as to be Y-axially distant from each other and symmetrical with respect to the X-axis.

According to the aspect of the above paragraph, X- and Y-axial forces can be accurately detected.

According to still another aspect of the present invention, the plurality of pairs of first and second switch electrodes are disposed so as to overlap the first and second electrodes with respect to a direction of displacement of the detective member.

According to the aspect of the above paragraph, because each of the switches constituted by the plurality of pairs of first and second switch electrodes is aligned with the corresponding resistor structure in the direction of displacement of the detective member, the operability is further improved.

According to still another aspect of the present invention, a resistance type sensor comprises a detective member; a pair of first electrodes disposed on an X-axis so as to be opposed to the detective member; a pair of second electrodes disposed on a Y-axis so as to be opposed to the detective member; pressure-sensitive resistive materials disposed between the pair of first electrodes and the pair of second electrodes so as to be opposed to the detective member; a third electrode disposed between the detective member and the pressure-sensitive resistive material between the pair of first electrodes so as to be opposed to the pressure-sensitive resistive material and displaceable toward the pressure-sensitive resistive material together with the detective member; a fourth electrode disposed between the detective member and the pressure-sensitive resistive material between the pair of second electrodes so as to be opposed to the pressure-sensitive resistive material and displaceable toward the pressure-sensitive resistive material together with the detective member; a plurality of first switch electrodes disposed so as to be opposed to the detective member and kept at a ground potential; and a plurality of second switch electrodes disposed so as to pair off with the respective first switch electrodes and be distant from the respective first switch electrodes. The second switch electrodes are kept at a potential different from the ground potential. Each of the second switch electrodes is displaceable toward the corresponding first switch electrode to come into contact with the corresponding first switch electrode when the detective member is displaced. When at least one pair of first and second switch electrodes are distant from each other, the sensor can detect displacement of a portion of the detective member corresponding to an X-axial direction on the basis of detection of a change in resistance value between the pair of first electrodes; and can detect displacement of a portion of the detective member corresponding to a Y-axial direction on the basis of detection of a change in resistance value between the pair of second electrodes. When any pair of first and second switch electrodes are in contact with each other, the sensor can detect a central portion of the detective member on the basis of detection of a change in resistance value between the pair of first electrodes and a change in resistance value between the pair of second electrodes.

According to the aspect of the above paragraph, when at least one pair of first and second switch electrodes are distant from each other, the sensor can detect displacement of the portion of the detective member corresponding to the X-axial direction on the basis of detection of a change in resistance value between the pair of first electrodes; and can detect displacement of the portion of the detective member corresponding to the Y-axial direction on the basis of detection of a change in resistance value between the pair of second electrodes. On the other hand, when any pair of first and second switch electrodes are in contact with each other, the sensor can detect the central portion of the detective member on the basis of detection of a change in resistance value between the pair of first electrodes and a change in resistance value between the pair of second electrodes. In short, the sensor can detect the displacements of the different portions of the detective member in accordance with conditions of contact between the plurality of pairs of first and second switch electrodes. Thus, X- and Y-axial outputs on the respective X- and Y-axes and an output on another axis than the X- and Y-axes, for example, a Z-axial output, can be obtained exclusively for each other. As a result, the operability is improved and erroneous operations decreases.

According to still another aspect of the present invention, the sensor comprises two pairs of first electrodes disposed so as to be X-axially distant from each other and symmetrical with respect to the Y-axis; and two pairs of second electrodes disposed so as to be Y-axially distant from each other and symmetrical with respect to the X-axis.

According to the aspect of the above paragraph, X- and Y-axial forces can be accurately detected.

According to still another aspect of the present invention, the plurality of pairs of first and second switch electrodes are disposed so as to overlap the third and fourth electrodes with respect to a direction of displacement of the detective member.

According to the aspect of the above paragraph, because each of the switches constituted by the plurality of pairs of first and second switch electrodes is aligned with the corresponding resistor structure in the direction of displacement of the detective member, the operability is further improved.

According to still another aspect of the present invention, a resistance type sensor comprises a detective member; a first electrode disposed on a predetermined axis so as to be opposed to the detective member; a second electrode disposed between the detective member and the first electrode so as to be opposed to the-first electrode and displaceable toward the first electrode together with the detective member; a pressure-sensitive resistive material disposed between the first and second electrodes; a plurality of first switch electrodes disposed so as to be opposed to the detective member and kept at a ground potential; and a plurality of second switch electrodes disposed so as to pair off with the respective first switch electrodes and be distant from the respective first switch electrodes. The second switch electrodes are kept at a potential different from the ground potential. Each of the second switch electrodes being displaceable toward the corresponding first switch electrode to come into contact with the corresponding first switch electrode when the detective member is displaced. When at least one pair of first and second switch electrodes are distant from each other, the sensor can detect displacement of a portion of the detective member corresponding to a direction along the predetermined axis on the basis of detection of a change in resistance value between the first and second electrodes. When any pair of first and second switch electrodes are in contact with each other, the sensor can detect a central portion of the detective member on the basis of detection of a change in resistance value between the first and second electrodes.

According to the aspect of the above paragraph, when at least one pair of first and second switch electrodes are distant from each other, the-sensor can detect displacement of the portion of the detective member corresponding to the direction along the predetermined axis on the basis of detection of a change in resistance value between the first and second electrodes. On the other hand, when any pair of first and second switch electrodes are in contact with each other, the sensor can detect the central portion of the detective member on the basis of detection of a change in resistance value between the first and second electrodes. In short, the sensor can detect the displacements of the different portions of the detective member in accordance with conditions of contact between the plurality of pairs of first and second switch electrodes. Thus, an output on the predetermined axis and an output on another axis than the predetermined axis, for example, a Z-axial output, can be obtained exclusively for each other. As a result, the operability is improved and erroneous operations decreases.

According to still another aspect of the present invention, a resistance type sensor comprises a detective member; a pair of first electrodes disposed on a predetermined axis so as to be opposed to the detective member; a pressure-sensitive resistive material disposed between the pair of first electrodes so as to be opposed to the detective member; a second electrode disposed between the detective member and the pressure-sensitive resistive material between the pair of first electrodes so as to be opposed to the pressure-sensitive resistive material and displaceable toward the pressure-sensitive resistive material together with the detective member; a plurality of first switch electrodes disposed so as to be opposed to the detective member and kept at a ground potential; and a plurality of second switch electrodes disposed so as to pair off with the respective first switch electrodes and be distant from the respective first switch electrodes. The second switch electrodes are kept at a potential different from the ground potential. Each of the second switch electrodes is displaceable toward the corresponding first switch electrode to come into contact with the corresponding first switch electrode when the detective member is displaced. When at least one pair of first and second switch electrodes are distant from each other, the sensor can detect displacement of a portion of the detective member corresponding to a direction along the predetermined axis on the basis of detection of a change in resistance value between the pair of first electrodes. When any pair of first and second switch electrodes are in contact with each other, the sensor can detect a central portion of the detective member on the basis of detection of a change in resistance value between the pair of first electrodes.

According to the aspect of the above paragraph, when at least one pair of first and second switch electrodes are distant from each other, the sensor can detect displacement of the portion of the detective member corresponding to the direction along the predetermined axis on the basis of detection of a change in resistance value between the pair of first electrodes. On the other hand, when any pair of first and second switch electrodes are in contact with each other, the sensor can detect the central portion of the detective member on the basis of detection of a change in resistance value between the pair of first electrodes. In short, the sensor can detect the displacements of the different portions of the detective member in accordance with conditions of contact between the plurality of pairs of first and second switch electrodes. Thus, an output on the predetermined axis and an output on another axis than the predetermined axis, for example, a Z-axial output, can be obtained exclusively for each other. As a result, the operability is improved and erroneous operations decreases.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

Hereinafter, preferred embodiments of the present invention will be described with reference to the accompanying drawings. In the embodiments as will be described below, a resistance type sensor of the present invention is applied to a joystick, as a pointing device, connected to a display unit of a personal computer system, a car navigation system, or the like.

Figure 1:
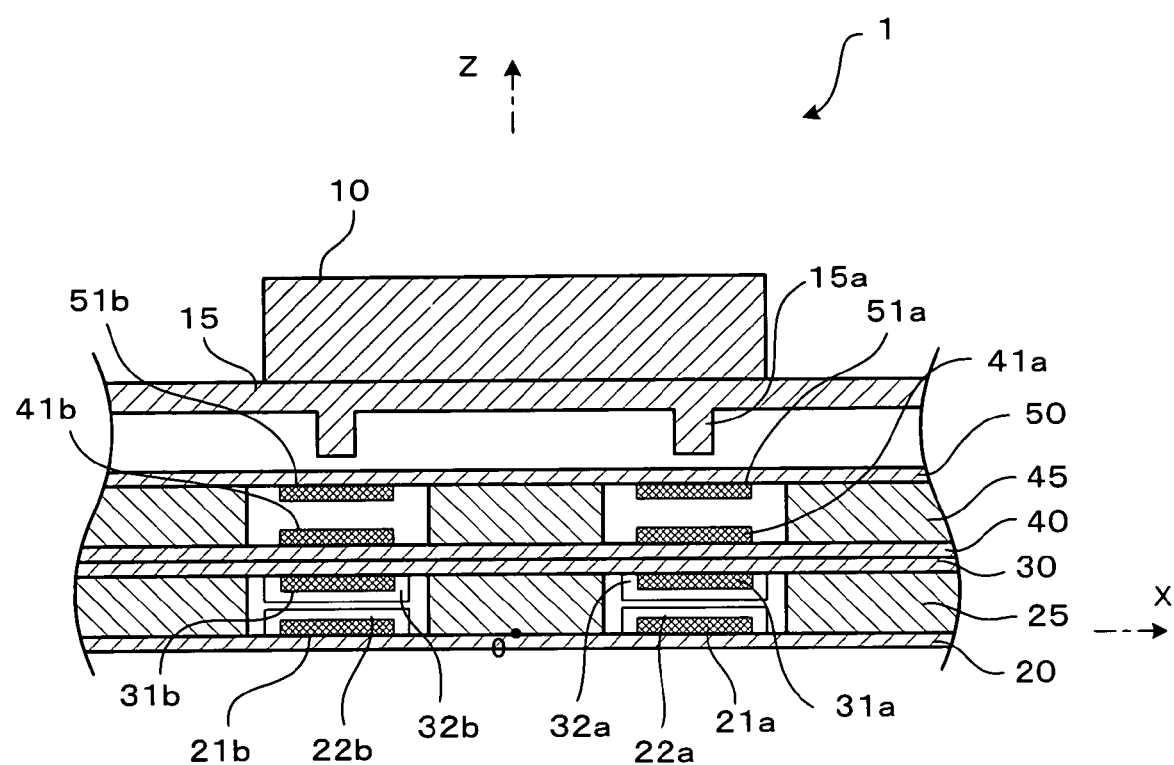
FIG. 1 is a schematic sectional view of a resistance type sensor according to a first embodiment of the present invention.
Figure 2:
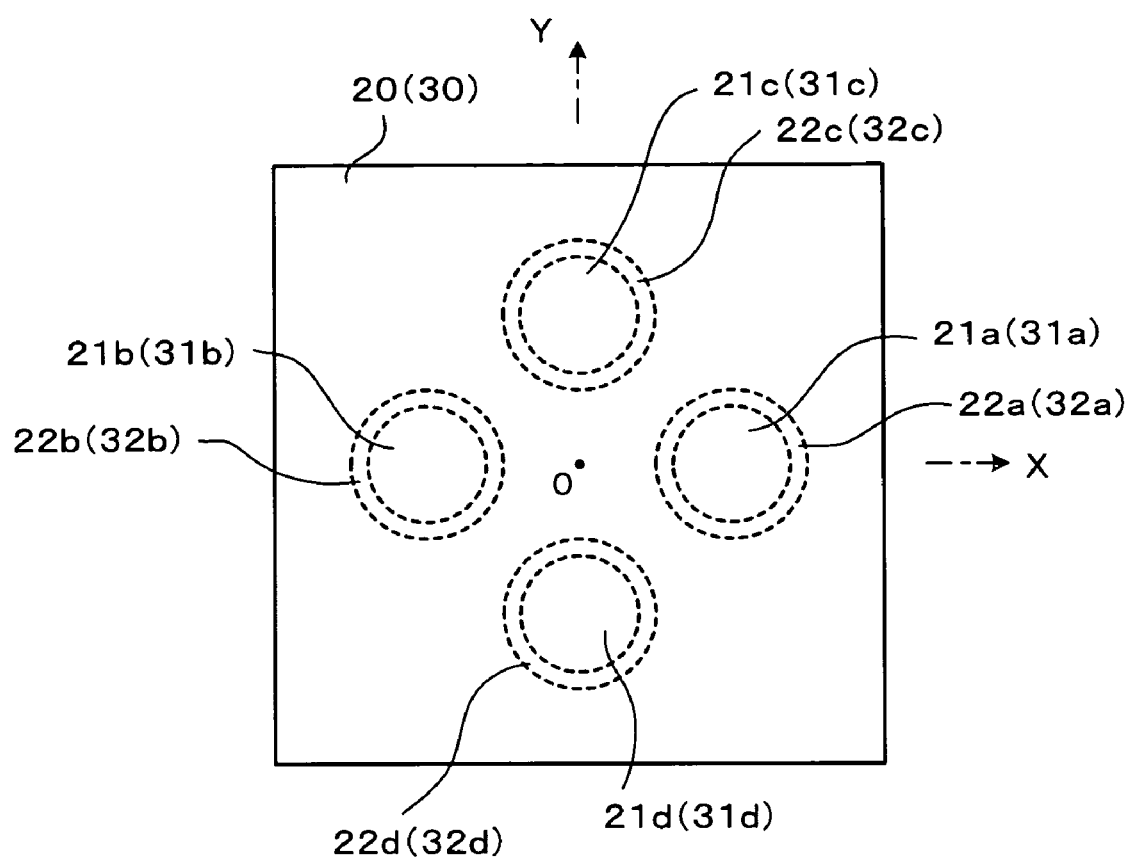
FIG. 2 is a view showing the arrangement of electrodes of the resistance type sensor of FIG. 1.
Figure 3:
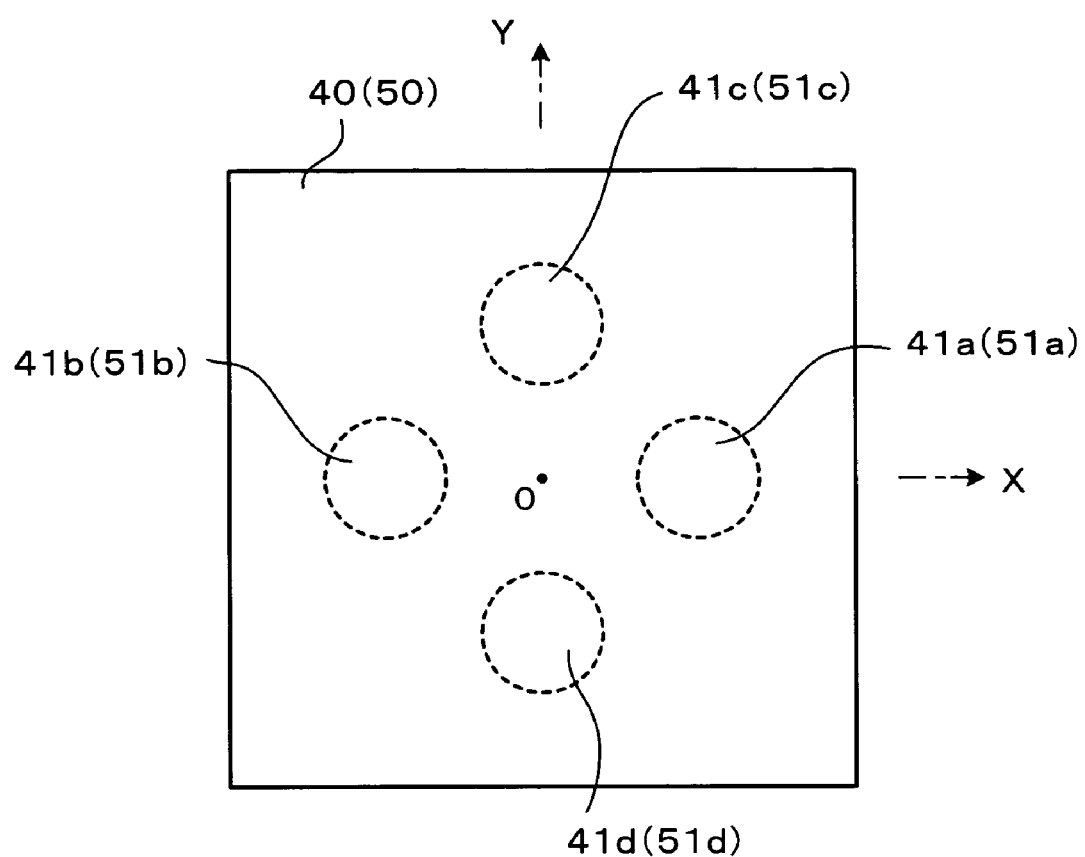
FIG. 3 is a view showing the arrangement of electrodes of the resistance type sensor of FIG. 1.

FIG. 1 is a schematic sectional view of a resistance type sensor according to a first embodiment of the present invention. FIGS. 2 and 3 show the arrangements of electrodes of the resistance type sensor of FIG. 1. FIG. 2 is a plan view of a membrane sheet 20 or 30, in which electrodes are shown by broken lines. FIG. 3 is a plan view of a membrane sheet 40 or 50, in which electrodes are shown by broken lines.

The resistance type sensor 1 includes an operation button 10 and membrane sheets 20, 30, 40, and 50. The operation button 10 is to be operated by a human or the like, and thereby an external force is applied to the operation button 10. Each of the membrane sheets 20, 30, 40, and 50 is made of, for example, a PET film.

As shown in FIG. 2, electrodes 21a to 21d are formed on the upper surface of the membrane sheet 20. The electrodes 21a to 21d are covered with resistive materials 22a to 22d, respectively. Electrodes 31a to 31d are formed on the lower surface of the membrane sheet 30. The electrodes 31a to 31d are covered with resistive materials 32a to 32d, respectively. The membrane sheets 20 and 30 are connected to each other by spacers 25 so that the resistive materials 22a to 22d are opposed to and normally distant from the respective resistive materials 32a to 32d.

As shown in FIG. 3, switch electrodes 41a to 41d are formed on the upper surface of the membrane sheet 40. Switch electrodes 51a to 51d are formed on the lower surface of the membrane sheet 50. The membrane sheets 40 and 50 are connected to each other by spacers 45 so that the electrodes 41a to 41d are opposed to and normally distant from the respective electrodes 51a to 51d.

In this example, an XYZ three-dimensional coordinate system is defined as shown in FIGS. 1 to 3 for convenience of explanation, and the arrangement of components will be explained with reference to the coordinate system. More specifically, in FIG. 1, the origin O is defined on the upper surface of the membrane sheet 20 at the center of the electrodes 21a to 21d; the X-axis is defined so as to extend horizontally rightward; the Z-axis is defined so as to extend vertically upward; and the Y-axis is defined so as to extend backward perpendicularly to FIG. 1. Thus, the upper surface of the membrane sheet 20 is on the XY plane. The Z-axis extends through the respective centers of the electrodes 31a to 31d, 41a to 41d, and 51a to 51d on the membrane sheets 30, 40, and 50; and the center of the operation button 10.

The lower surface of the membrane sheet 40 is put on the upper surface of the membrane sheet 30. At this time, the electrode 21a covered with the resistive material 22a on the membrane sheet 20, the electrode 31a covered with the resistive material 32a on the membrane sheet 30, the electrode 41a on the membrane sheet 40, and the electrode 51a on the membrane sheet 50, are disposed so as to overlap one another at a position corresponding to the X-axial positive direction. The electrode 21b with the resistive material 22b on the membrane sheet 20, the electrode 31b with the resistive material 32b on the membrane sheet 30, the electrode 41b on the membrane sheet 40, and the electrode 51b on the membrane sheet 50, are disposed so as to overlap one another at a position corresponding to the X-axial negative direction.

Likewise, the electrode 21c with the resistive material 22c on the membrane sheet 20, the electrode 31c with the resistive material 32c on the membrane sheet 30, the electrode 41c on the membrane sheet 40, and the electrode 51c on the membrane sheet 50, are disposed so as to overlap one another at a position corresponding to the Y-axial positive direction. The electrode 21d with the resistive material 22d on the membrane sheet 20, the electrode 31d with the resistive material 32d on the membrane sheet 30, the electrode 41d on the membrane sheet 40, and the electrode 51d on the membrane sheet 50, are disposed so as to overlap one another at a position corresponding to the Y-axial negative direction.

Thus, the electrodes 21a to 21d covered with the respective resistive materials 22a to 22d on the membrane sheet 20 are arranged around the origin O at regular angular intervals of 90 degrees. The electrodes 21a and 21b, and the resistive materials 22a and 22b, are X-axially distant from each other so as to be symmetrical with respect to the Y-axis. The electrodes 21c and 21d, and the resistive materials 22c and 22d, are Y-axially distant from each other so as to be symmetrical with respect to the X-axis. The same applies to the electrodes 31a to 31d, the resistive materials 32a to 32d, the electrodes 41a to 41d, and the electrodes 51a to 51d on the membrane sheets 30, 40, and 50.

The operation button 10 is formed into a circular member. The operation button 10 is fixed to the upper surface of a supporting layer 15 disposed so as to be distant from the upper surface of the membrane sheet 50. The center of the operation button 10 is on the Z-axis, and coincides with the center of four electrodes of each membrane sheet. Four protrusions 15a are formed on the lower surface of the supporting layer 15 so as to protrude toward the membrane sheet 50. The protrusions 15a are positioned so as to correspond to the respective centers of the electrodes corresponding to the X-axial positive direction, the X-axial negative direction, the Y-axial positive direction, and the Y-axial negative direction. The supporting layer 15 is made of an elastic material such as silicone rubber.

Figure 4:
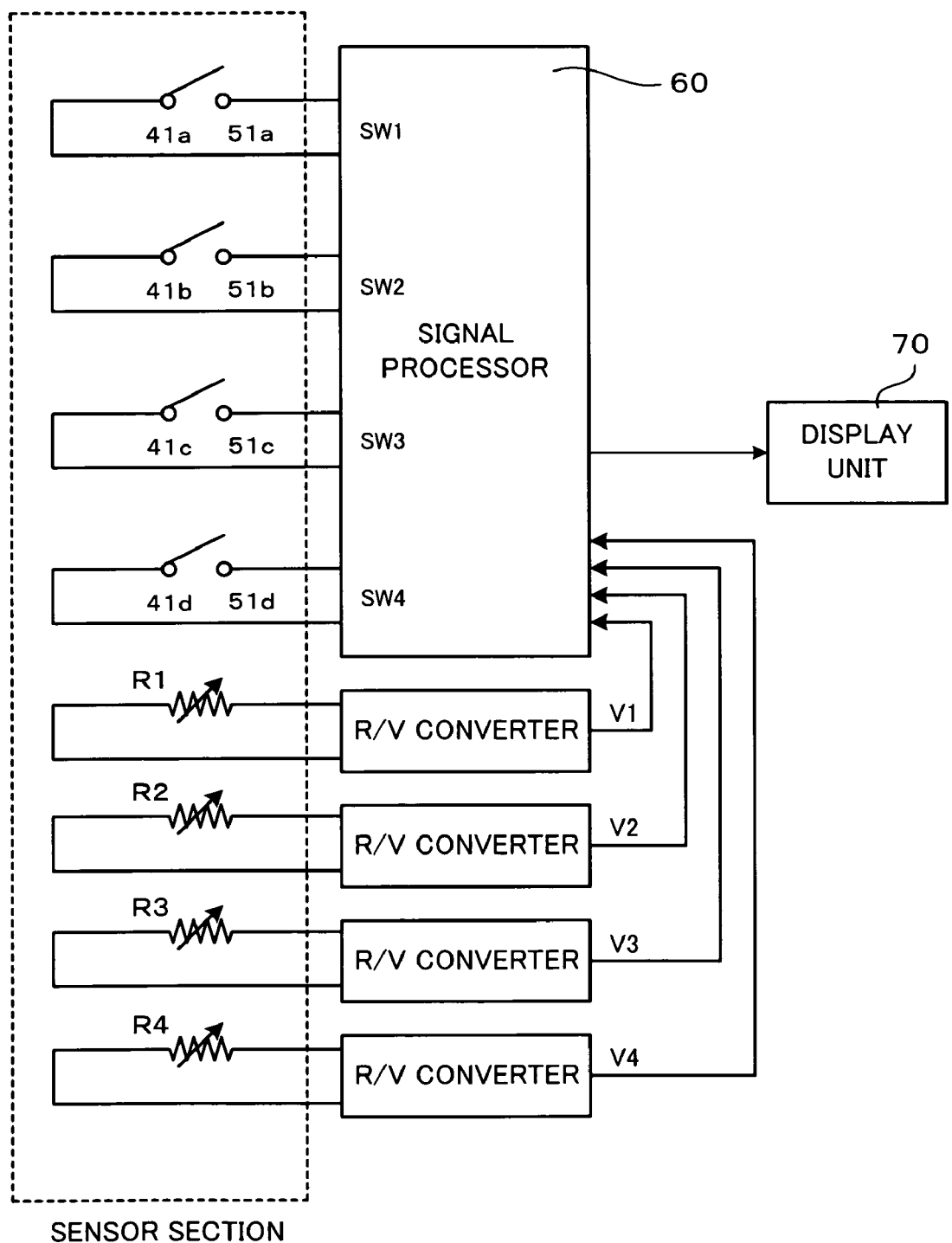
FIG. 4 is a block circuit diagram showing a circuit construction of the resistance type sensor.

Next, a circuit construction of the resistance type sensor 1 will be described with reference to FIG. 4. FIG. 4 is a block circuit diagram showing a circuit construction of the resistance type sensor.

In the resistance type sensor 1, the resistive materials 22a to 22d on the membrane sheet 20 cooperate with the respective resistive materials 32a to 32d on the membrane sheet 30 opposed to the resistive materials 22a to 22d to form variable resistors R1 to R4 as contact resistances. The variable resistors R1 to R4 are connected to R/V converters, and voltage signals V1 to V4 converted by the respective R/V converters are input to a signal processor 60.

In the resistance type sensor 1, the electrodes 41a to 41d on the membrane sheet 40 cooperate with the respective electrodes 51a to 51d on the membrane sheet 50 opposed to the electrodes 41a to 41d to form switches SW1 to SW4. ON/OFF signals of the switches SW1 to SW4 are input to the signal processor 60. The signal processor 60 outputs signals, such as a cursor movement signal, to a display unit 70 connected to the resistance type sensor 1.

For example, when a portion of the operation button 10 corresponding to the X-axial positive direction is pressed downward, the protrusion 15a of the supporting layer 15 corresponding to the X-axial positive direction is brought into contact with the upper surface of the membrane sheet 50, and then the electrode 51a is brought into contact with the electrode 41a. When the operation button 10 is further pressed, the resistive material 32a is brought into contact with the resistive material 22a. In this case, because the switch SW1 is turned on when the electrode 51a has been brought into contact with the electrode 41a, it can be detected that a portion of the operation button 10 corresponding to the X-axial positive direction is operated. In addition, because the contact resistance of the variable resistor R1 changes in accordance with the condition of contact between the resistive materials 32a and 22a, this makes it possible to detect the magnitude of the force applied to the portion of the operation button 10 corresponding to the X-axial positive direction. The case is similar wherein a portion of the operation button 10 corresponding to the X-axial negative direction, the Y-axial positive direction, or the Y-axial negative direction, is pressed downward.

Thus, when a portion of the operation button 10 corresponding to one of the X-axial positive direction, the X-axial negative direction, the Y-axial positive direction, and the Y-axial negative direction, is pressed downward, the operation button 10 is inclined to turn one of the switches SW1 to SW4 on. In accordance with the direction of the inclination of the operation button 10, two or three of the switches SW1 to SW4 may be turned on. Contrastingly, when a portion near the center of the operation button 10 is pressed downward, that is, when the operation button 10 is pressed downward with being kept horizontal, all of the switches SW1 to SW4 are turned on.

Figure 5:
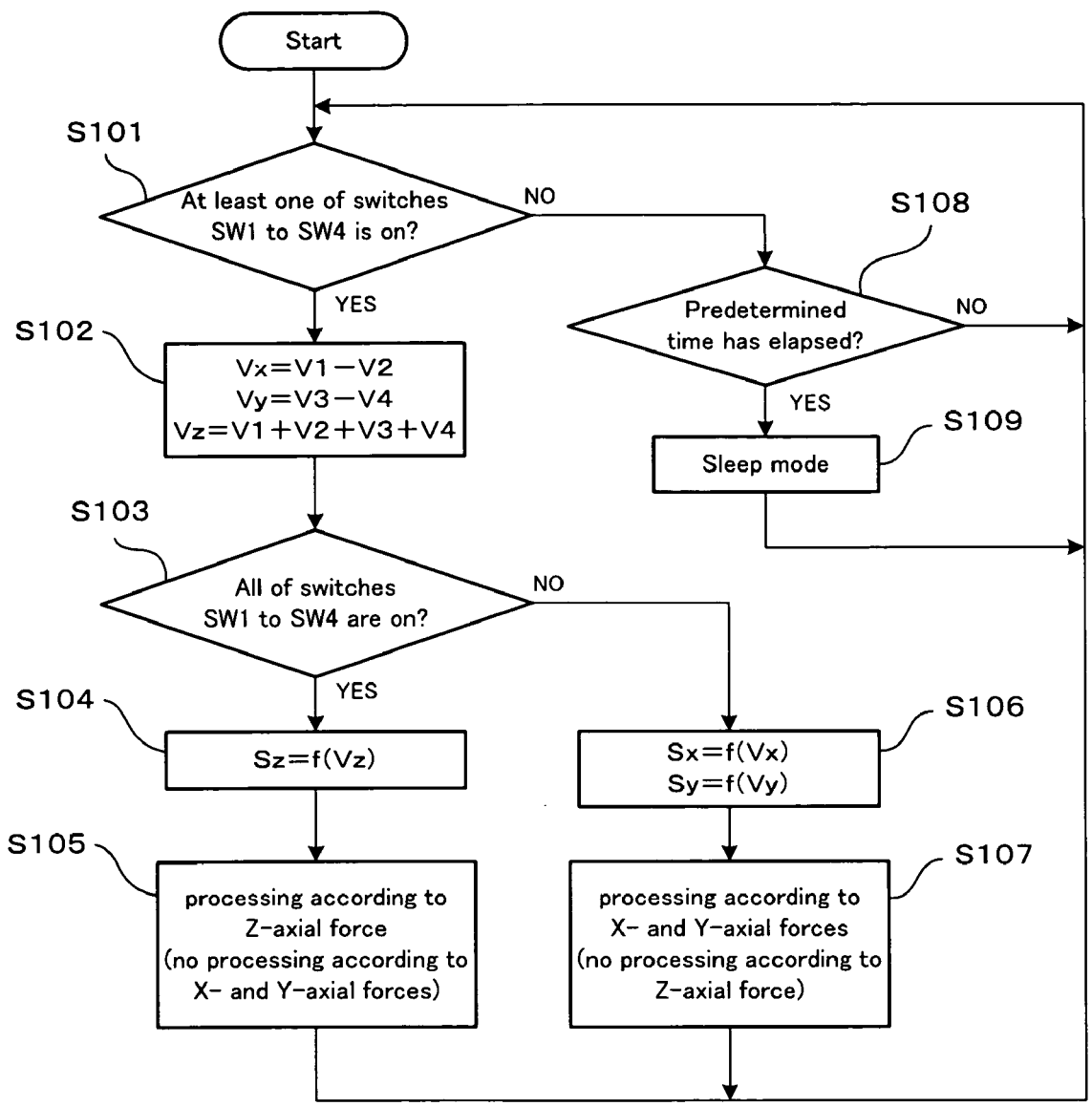
FIG. 5 is a flowchart showing a procedure in a signal processor of the resistance type sensor.

Next, a procedure in the signal processor 60 of the resistance type sensor 1 will be described with reference to FIG. 5. FIG. 5 is a flowchart showing a procedure in the signal processor of the resistance type sensor.

In Step S101, it is judged whether or not at least one of the switches SW1 to SW4 is on. When at least one of the switches SW1 to SW4 is on, the following calculations are performed using the voltage signals V1 to V4 converted by the R/V converters connected to the respective variable contact resistors R1 to R4:

$$Vx = V1 - V2$$

$$Vy = V3 - V4$$

$$Vz = V1 + V2 + V3 + V4$$

The above calculations may be carried out by using a microcomputer or the like after the voltage signals are converted into digital signals by A/D converters or the like; or may be carried out by using operation (OP) amplifiers. Otherwise, bridge circuits may be constructed to directly output the results of the calculations. Further, the calculation for Vz is not limited to the above expression. An expression containing at least one of V1, V2, V3, and V4 may be used for calculation of Vz.

In Step S103, it is judged whether or not all of the switches SW1 to SW4 are on. When all of the switches SW1 to SW4 are on, the signal Vz obtained by the above calculations is converted into an appropriate output signal Sz, in Step S104. The output signal Sz is output to a display unit of a personal computer system or a car navigation system, in which processing is performed according to the Z-axial force, in Step S105. In this case, because output signals Sx and Sy obtained by conversion from the respective signals Vx and Vy indicate that the operation button 10 is not operated X- and Y-axially, processing according to X- and Y-axial forces is not performed.

On the other hand, when some of the switches SW1 to SW4 are off, the signals Vx and Vy obtained by the above calculations are converted into appropriate output signals Sx and Sy, in Step S106. The output signals Sx and Sy are output to the display unit of the personal computer system or the car navigation system, in which processing is performed according to the X- and Y-axial forces, in Step S107. In this case, because the output signal Sz obtained by conversion from the signal Vz indicates that the operation button 10 is not operated Z-axially, processing according to Z-axial force is not performed.

As described above, when all of the switches SW1 to SW4 are on, processing based on the output signals Sx and Sy is not performed and processing based on the output signal Sz is only performed. On the other hand, when some of the switches SW1 to SW4 are off, processing based on the output signal Sz is not performed and processing based on the output signals Sx and Sy is only performed.

When any of the switches SW1 to SW4 is off as the result of the judgment of Step S101, it is then judged in Step S108 whether or not a predetermined time has elapsed. When it is decided that the predetermined time has elapsed, the operation mode is changed from a normal mode into a sleep mode so that the system is put into a power-saving state, in Step S109. Afterward, when it is detected that at least one of the switches SW1 to SW4 has been turned on, the operation mode is changed into the normal mode.

Figure 6:
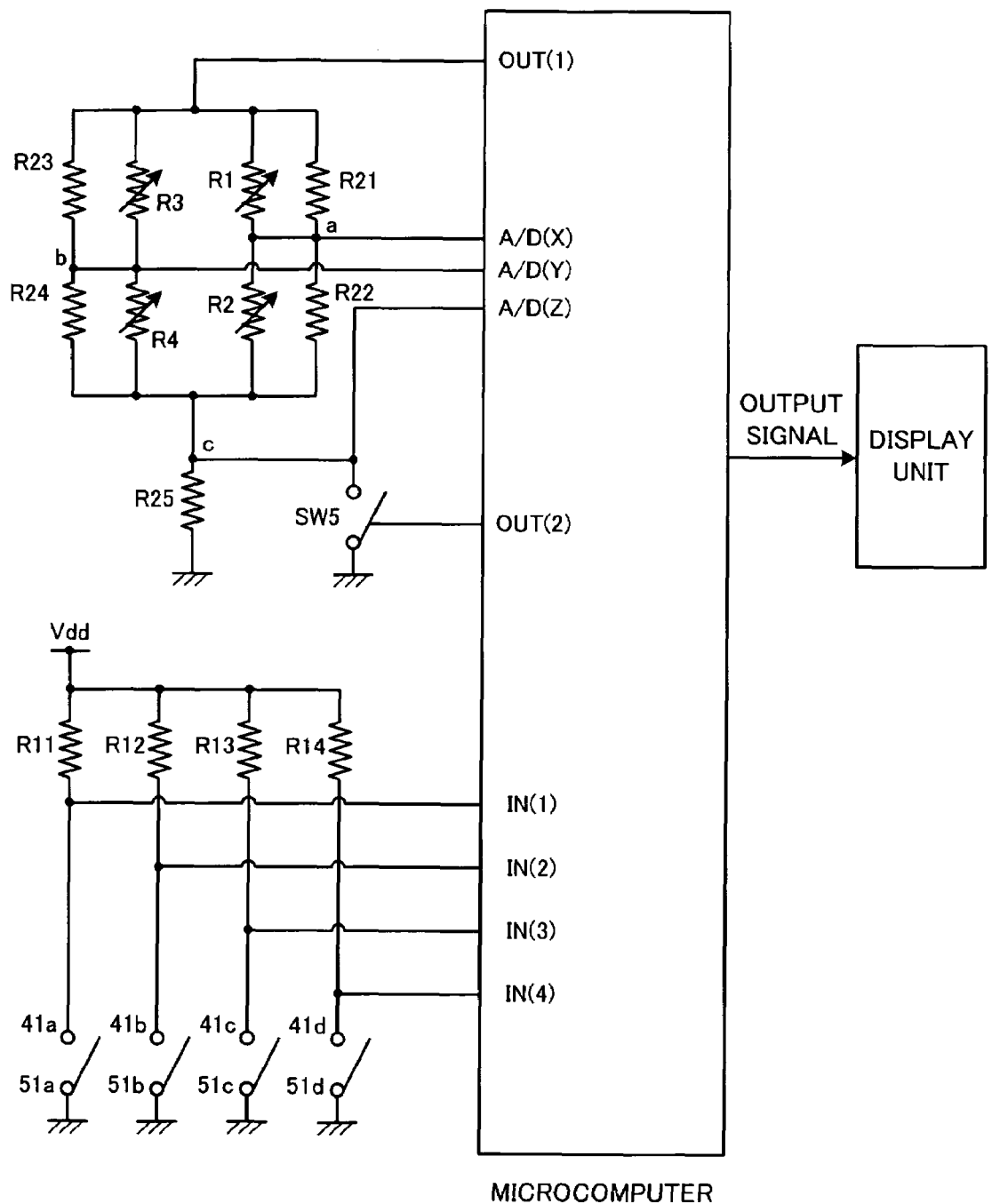
FIG. 6 is a block circuit diagram showing an example of a specific circuit construction of the resistance type sensor.

Next, an example of a specific circuit construction of the resistance type sensor 1 will be described with reference to FIG. 6. FIG. 6 is a block circuit diagram showing an example of a specific circuit construction of the resistance type sensor.

The electrodes 41a to 41d on the membrane sheet 40 are connected to respective input ports IN(1) to IN(4) of a microcomputer with being pulled up by resistances R11 to R14. The electrodes 51a to 51d on the membrane sheet 50 are grounded. In this example, the input signals to the input ports IN(1) to IN(4) correspond to the signals from the switches SW1 to SW4 of FIG. 4, respectively.

The variable resistor R1 is connected in series to the variable resistor R2. The variable resistor R3 is connected in series to the variable resistor R4. Resistances R21 to R24 are connected in parallel to the respective variable resistors R1 to R4. An output port OUT(1) outputs a power supply voltage Vdd in a normal operation. In this example, the resistances R21 to R24 are connected in parallel for outputting voltages in accordance with voltage dividing of the combined resistances of the variable resistors R1 to R4 and the resistances R21 to R24 to nodes a and b when the resistive materials constituting the respective variable resistors R1 to R4 are distant from each other. In another example, however, such resistances R21 to R24 may not be connected in parallel to the respective variable resistors R1 to R4.

One terminal of each of the variable resistors R1 and R3 is connected to the output port OUT(1). One terminal of each of the variable resistors R2 and R4 is grounded through a resistance R25. The resistance R25 is connected in parallel to a switch SW5, which can be turned on/off from an output port OUT(2). Nodes a, b, and c are connected to A/D converter ports A/D(X), A/D(Y), and A/D(Z), respectively.

In a normal operation, the power supply voltage Vdd is output from the output port OUT(1) to apply the power supply voltage Vdd to the bridge circuit. When some of the switches SW1 to SW4 are off, the output port OUT(2) is set at the power supply voltage Vdd to turn the switch SW5 on. The voltages of the nodes a and b taken through the respective A/D converter ports A/D(X) and A/D(Y) of the microcomputer are used as X- and Y-axial data Vx and Vy, which are subjected to appropriate processing and then output to a controller of a car navigation system or a cellular phone to move a cursor on a display unit of the car navigation system or the cellular phone. In this case, although the data of the A/D converter port A/D(Z) gives information on the Z-axis, the A/D converter port A/D(Z) is connected to the ground (GND) potential. Thus, the data of the A/D converter port A/D(Z) is stable and unchanged to correspond to the GND potential irrespective of the condition of depression of the operation button 10.

On the other hand, when any of the switches SW1 to SW4 has been turned on, the output port OUT(2) of the microcomputer is set at the GND potential to turn the switch SW5 off. Thereby, the bridge circuit constituted by the variable resistors R1 to R4 and the resistances R21 to R24 falls in a state of being connected in series to the resistance R25, and thus the node c is set at a voltage divided by the resistances. This is a state wherein the operation button 10 has been Z-axially depressed, and the voltage of the node c corresponds to the force for Z-axially depressing the operation button 10. The microcomputer uses as Z-axial data Vz data taken through the A/D converter port A/D(Z); performs appropriate processing for the data; and then outputs the data to the controller of the car navigation system or the cellular phone, in which processing is performed in accordance with the Z-axial data. In this case, although the X- and Y-axial data Vx and Vy may change in accordance with the condition of depression of the operation button 10, the microcomputer performs processing on the assumption that the X- and Y-axial data Vx and Vy have not changed.

When a state wherein any of the switches SW1 to SW4 is off continues for a predetermined time, it is decided that the operation button 10 is not being operated. The output port OUT(1) of the microcomputer is then set at the GND potential to put the microcomputer in a sleep mode for power saving. In the sleeping mode, it is monitored whether at least one of the switches SW1 to SW4 is turned on, for example, by setting the respective input ports IN(1) to IN(4) of the microcomputer to interrupt inputs. When at least one of the switches SW1 to SW4 has been turned on, the microcomputer is restored to the normal operation mode. Power saving is thus intended.

In this embodiment, if dome-shaped metal plates are provided on the membrane sheet 40 concentrically with the respective electrodes 41a to 41d so as to cover the respective electrodes 41a to 41d with being distant from the respective electrodes 41a to 41d, this can give a feeling of clicking when the operation button 10 is operated.

As described above, in the case of applying the resistance type sensor 1 of this embodiment to a joystick as a pointing device, the following control is possible. For example, the X and Y outputs are used to move a cursor to an objective point on a map display unit of a car navigation system. When the operation button 10 is Z-axially depressed, the map being displayed is enlarged in accordance with a change in the Z-axial output. If the Z-axial output exceeds a predetermined threshold, the enlargement of the map is fixed even after the Z-axial depression is stopped. Afterward, when the operation button 10 is again Z-axially depressed and the Z-axial output exceeds the threshold, the fixation of the scale is reset and the map is scaled up/down to restore the map to the original scale. In this case, it is preferable that the operator can be informed by a sound or the like when the Z-axial output exceeds the threshold. Thus, because moving the cursor according to the X and Y outputs and scaling the map being displayed according to the Z-axial output can be performed independently of each other, no erroneous operation occurs and this makes the system easy to use.

Next, a resistance type sensor according to a second embodiment of the present invention will be described. The resistance type sensor 101 of the second embodiment differs from the resistance type sensor 1 of the first embodiment in the constructions of the electrodes and resistive materials on the membrane sheet 20. The same components of the resistance type sensor 101 as those of the resistance type sensor 1 are denoted by the same reference numerals as those of the resistance type sensor 1, respectively, to omit the detailed description thereof.

Figure 7:
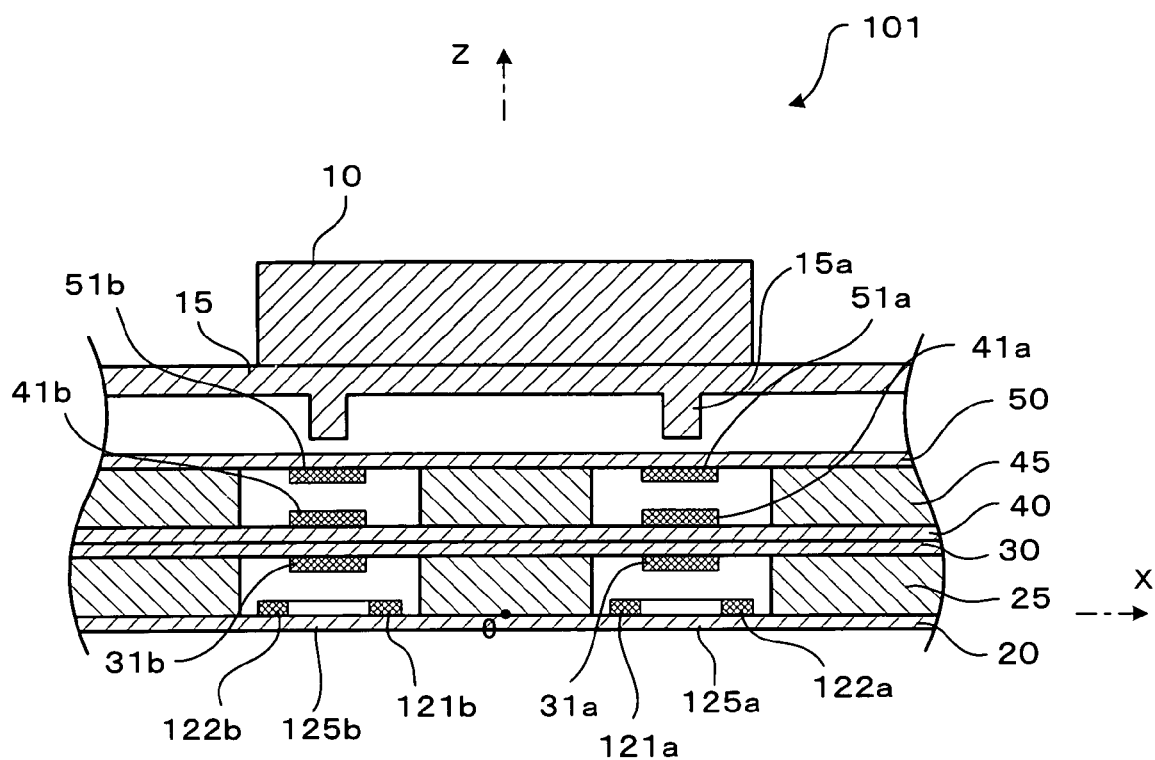
FIG. 7 is a schematic sectional view of a resistance type sensor according to a second embodiment of the present invention.

As shown in FIG. 7, the resistance type sensor 101 includes an operation button 10 and membrane sheets 20, 30, 40, and 50. The operation button 10 is to be operated by a human or the like, and thereby an external force is applied to the operation button 10.

Electrodes 121a to 121d and 122a to 122d and resistive materials 125a to 125d are formed on the upper surface of the membrane sheet 20. Electrodes 31a to 31d are formed on the lower surface of the membrane sheet 30. In the resistance type sensor 101, there are provided no resistive materials 32a to 32d to cover the respective electrodes 31a to 31d as in the first embodiment. The membrane sheets 20 and 30 are connected to each other by spacers 25 so that the resistive materials 125a to 125d are opposed to and normally distant from the respective electrodes 31a to 31d.

Figure 8:
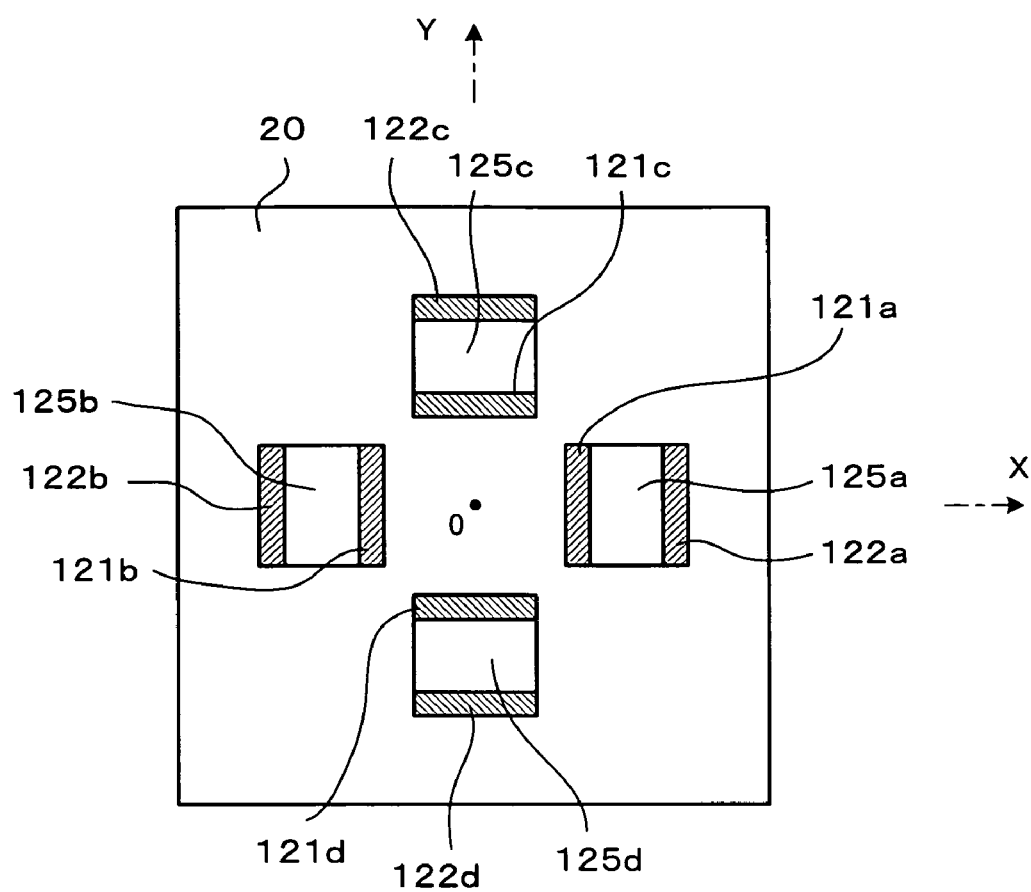
FIG. 8 is a view showing the arrangement of electrodes of the resistance type sensor of FIG. 7.

In this embodiment, as shown in FIG. 8, for example, the electrodes 121a and 122a and the resistive material 125a are disposed on the membrane sheet 20 so as to correspond to the X-axial positive direction. The electrodes 121a and 122a are X-axially distant from each other, and the resistive material 125a is sandwiched by the electrodes 121a and 122a. Likewise, the electrodes 121b and 122b and the resistive material 125b are disposed on the membrane sheet 20 so as to correspond to the X-axial negative direction; the electrodes 121c and 122c and the resistive material 125c are disposed on the membrane sheet 20 so as to correspond to the Y-axial positive direction; and the electrodes 121d and 122d and the resistive material 125d are disposed on the membrane sheet 20 so as to correspond to the Y-axial negative direction. The arrangement of the electrodes and the resistive material in each set is the same as the arrangement of the electrodes 121a and 122a and the resistive material 125a.

Thus, the resistance value of each of the resistive materials 125a to 125d is detected as the resistance value between the electrodes on both sides of the resistive material. For example, the resistance value of the resistive material 125a is detected as the resistance value between the electrodes 121a and 122a on both sides of the resistive material 125a.

As described above, the resistive materials 125a to 125d are opposed to the respective electrodes 31a to 31d. Thus, when a portion of the operation button 10 corresponding to the X-axial positive direction is pressed downward, the electrode 51a is brought into contact with the electrode 41a, and then the electrode 31a is brought into contact with the resistive material 125a. At this time, a bypass circuit is formed in the resistive material 125a in accordance with the condition of contact between the electrode 31a and the resistive material 125a, to decrease the resistance value between the electrodes 121a and 122a. Thus, the resistive material 125a and the electrode 31a constitute a variable resistor whose resistance value changes in accordance with the condition of depression of the operation button 10. The same applies to the respective resistive materials 125b to 125d.

Next, a resistance type sensor according to a third embodiment of the present invention will be described. The resistance type sensor of the third embodiment differs from the resistance type sensor 1 of the first embodiment in the constructions of the electrodes and resistive materials on the membrane sheet 20 and the construction of the signal processor. The resistance type sensor of this embodiment is the same as the resistance type sensor of the second embodiment in the construction other than the construction of the signal processor.

Figure 9:
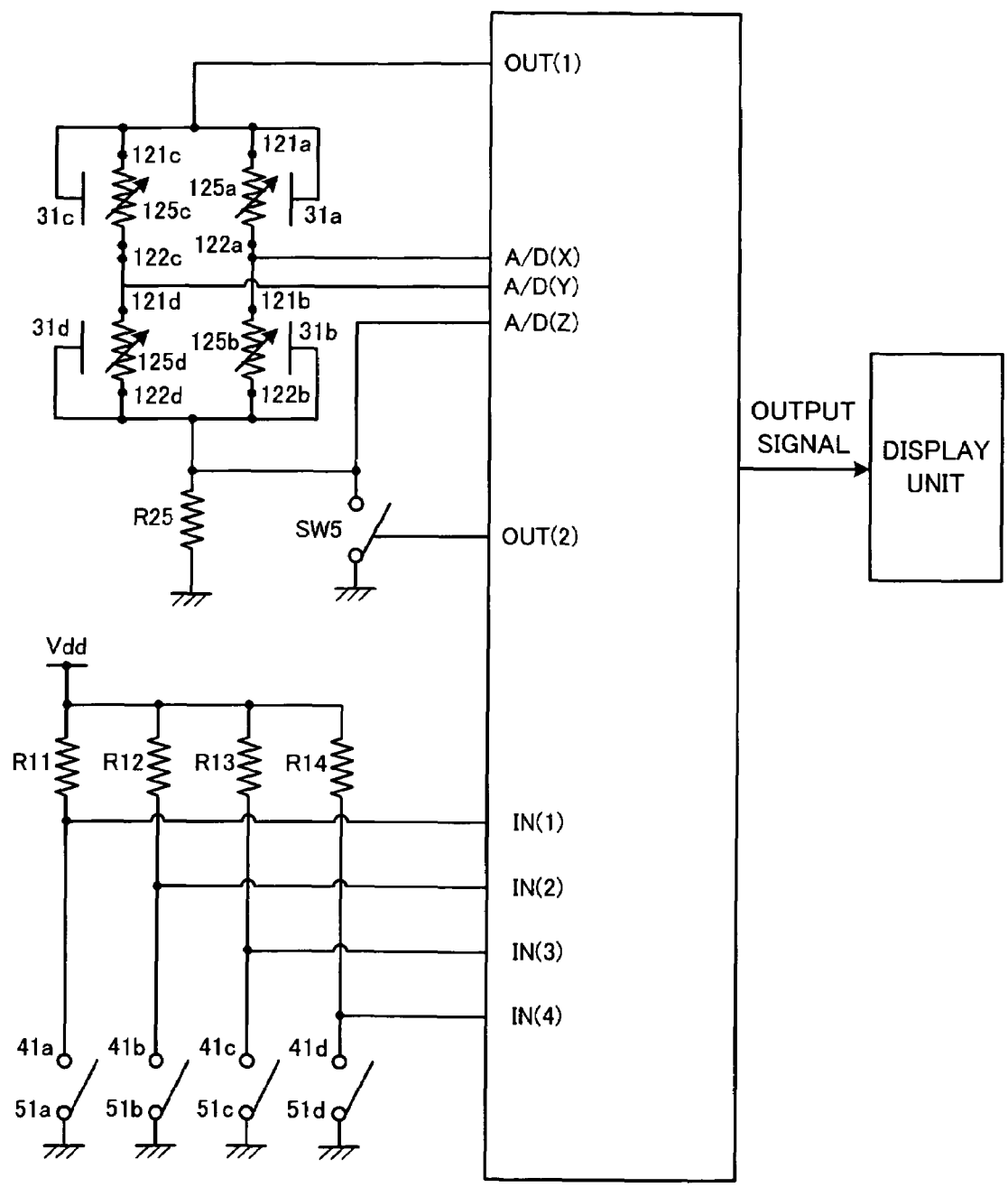
FIG. 9 is a block circuit diagram showing an example of a specific circuit construction of a resistance type sensor according to a third embodiment of the present invention.

In the signal processor of the resistance type sensor of this embodiment, as shown in FIG. 9, the electrodes 31a to 31d on the membrane sheet 30 are connected to the respective electrodes 121a to 121d disposed on one sides of the respective resistive materials 125a to 125d.

The preferred embodiments of the present invention have been described. However, the present invention is never limited to the above-described embodiments. For example, in the above-described embodiments, the resistance type sensor can output 3-axial signals of the X-, Y-, and Z-axial signals. In a modification, however, the resistance type sensor may output only 2-axial signals of the X- and Z-axial signals. In another modification, the resistance type sensor may output only 2-axial signals of the Y- and Z-axial signals.

In the above-described embodiments, the resistance type sensor includes a pair of electrodes disposed on each membrane so as to be X-axially distant from each other symmetrically with respect to the Y-axis, and a pair of electrodes disposed on each membrane so as to be Y-axially distant from each other symmetrically with respect to the X-axis. In a modification, however, only one electrode may be disposed on each of the X- and Y-axes on each membrane.

In the above-described embodiments, the switch electrodes 41a to 41d and 51a to 51d are disposed so as to overlap the respective electrodes 21a to 21d and 31a to 31d for detecting resistance values, in the direction of displacement of the operation button 10. In a modification, however, the former may not overlap the latter.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A resistance type sensor comprising:
a detective member;

a first electrode disposed on an X-axis so as to be opposed to the detective member;
a second electrode disposed on a Y-axis so as to be opposed to the detective member;
a third electrode disposed between the detective member and the first electrode so as to be opposed to the first electrode and displaceable toward the first electrode together with the detective member;
a fourth electrode disposed between the detective member and the second electrode so as to be opposed to the second electrode and displaceable toward the second electrode together with the detective member;
pressure-sensitive resistive materials disposed between the first and third electrodes and between the second and fourth electrodes;
a plurality of first switch electrodes disposed so as to be opposed to the detective member and kept at a ground potential; and
a plurality of second switch electrodes disposed so as to pair off with the respective first switch electrodes and be distant from the respective first switch electrodes, the second switch electrodes being kept at a potential different from the ground potential,
each of the second switch electrodes being displaceable toward the corresponding first switch electrode to come into contact with the corresponding first switch electrode when the detective member is displaced,
the sensor being able to detect displacement of a portion of the detective member corresponding to an X-axial direction on the basis of detection of a change in resistance value between the first and third electrodes, and to detect displacement of a portion of the detective member corresponding to a Y-axial direction on the basis of detection of a change in resistance value between the second and fourth electrodes, when at least one pair of first and second switch electrodes are distant from each other,
the sensor being able to detect a central portion of the detective member on the basis of detection of a change in resistance value between the first and third electrodes and a change in resistance value between the second and fourth electrodes, when any pair of first and second switch electrodes are in contact with each other.

2. The sensor according to claim 1, comprising:
a pair of first electrodes disposed so as to be X-axially distant from each other and symmetrical with respect to the Y-axis; and
a pair of second electrodes disposed so as to be Y-axially distant from each other and symmetrical with respect to the X-axis.

3. The sensor according to claim 1, wherein the plurality of pairs of first and second switch electrodes are disposed so as to overlap the first and second electrodes with respect to a direction of displacement of the detective member.

4. A resistance type sensor comprising:
a detective member;
a pair of first electrodes disposed on an X-axis so as to be opposed to the detective member;
a pair of second electrodes disposed on a Y-axis so as to be opposed to the detective member;
pressure-sensitive resistive materials disposed between the pair of first electrodes and the pair of second electrodes so as to be opposed to the detective member;
a third electrode disposed between the detective member and the pressure-sensitive resistive material between the pair of first electrodes so as to be opposed to the pressure-sensitive resistive material and displaceable toward the pressure-sensitive resistive material together with the detective member;
a fourth electrode disposed between the detective member and the pressure-sensitive resistive material between the pair of second electrodes so as to be opposed to the pressure-sensitive resistive material and displaceable toward the pressure-sensitive resistive material together with the detective member;
a plurality of first switch electrodes disposed so as to be opposed to the detective member and kept at a ground potential; and
a plurality of second switch electrodes disposed so as to pair off with the respective first switch electrodes and be distant from the respective first switch electrodes, the second switch electrodes being kept at a potential different from the ground potential,
each of the second switch electrodes being displaceable toward the corresponding first switch electrode to come into contact with the corresponding first switch electrode when the detective member is displaced,
the sensor being able to detect displacement of a portion of the detective member corresponding to an X-axial direction on the basis of detection of a change in resistance value between the pair of first electrodes, and to detect displacement of a portion of the detective member corresponding to a Y-axial direction on the basis of detection of a change in resistance value between the pair of second electrodes, when at least one pair of first and second switch electrodes are distant from each other,
the sensor being able to detect a central portion of the detective member on the basis of detection of a change in resistance value between the pair of first electrodes and a change in resistance value between the pair of second electrodes, when any pair of first and second switch electrodes are in contact with each other.

5. The sensor according to claim 4, comprising:
two pairs of first electrodes disposed so as to be X-axially distant from each other and symmetrical with respect to the Y-axis; and
two pairs of second electrodes disposed so as to be Y-axially distant from each other and symmetrical with respect to the X-axis.

6. The sensor according to claim 4, wherein the plurality of pairs of first and second switch electrodes are disposed so as to overlap the third and fourth electrodes with respect to a direction of displacement of the detective member.

7. A resistance type sensor comprising:
a detective member;
a first electrode disposed on a predetermined axis so as to be opposed to the detective member;
a second electrode disposed between the detective member and the first electrode so as to be opposed to the first electrode and displaceable toward the first electrode together with the detective member;
a pressure-sensitive resistive material disposed between the first and second electrodes;
a plurality of first switch electrodes disposed so as to be opposed to the detective member and kept at a ground potential; and
a plurality of second switch electrodes disposed so as to pair off with the respective first switch electrodes and be distant from the respective first switch electrodes, the second switch electrodes being kept at a potential different from the ground potential,
each of the second switch electrodes being displaceable toward the corresponding first switch electrode to come into contact with the corresponding first switch electrode when the detective member is displaced, the sensor being able to detect displacement of a portion of the detective member corresponding to a direction along the predetermined axis on the basis of detection of a change in resistance value between the first and second electrodes when at least one pair of first and second switch electrodes are distant from each other, the sensor being able to detect a central portion of the detective member on the basis of detection of a change in resistance value between the first and second electrodes when any pair of first and second switch electrodes are in contact with each other.

8. A resistance type sensor comprising:

a detective member;

a pair of first electrodes disposed on a predetermined axis so as to be opposed to the detective member;

a pressure-sensitive resistive material disposed between the pair of first electrodes so as to be opposed to the detective member;

a second electrode disposed between the detective member and the pressure-sensitive resistive material between the pair of first electrodes so as to be opposed to the pressure-sensitive resistive material and displaceable toward the pressure-sensitive resistive material together with the detective member;

a plurality of first switch electrodes disposed so as to be opposed to the detective member and kept at a ground potential; and a plurality of second switch electrodes disposed so as to pair off with the respective first switch electrodes and be distant from the respective first switch electrodes, the second switch electrodes being kept at a potential different from the ground potential, each of the second switch electrodes being displaceable toward the corresponding first switch electrode to come into contact with the corresponding first switch electrode when the detective member is displaced, the sensor being able to detect displacement of a portion of the detective member corresponding to a direction along the predetermined axis on the basis of detection of a change in resistance value between the pair of first electrodes when at least one pair of first and second switch electrodes are distant from each other, the sensor being able to detect a central portion of the detective member on the basis of detection of a change in resistance value between the pair of first electrodes when any pair of first and second switch electrodes are in contact with each other.

* * * * *